United States Patent
Pawar et al.

(10) Patent No.: US 11,954,823 B2
(45) Date of Patent: Apr. 9, 2024

(54) METHOD AND SYSTEM OF IMAGE RECONSTRUCTION FOR MAGNETIC RESONANCE IMAGING

(71) Applicant: MONASH UNIVERSITY, Clayton (AU)

(72) Inventors: Kamlesh Pawar, Clayton (AU); Zhaolin Chen, Clayton (AU); Nadim Joni Shah, Clayton (AU); Gary Francis Egan, Clayton (AU)

(73) Assignee: Monash University, Victoria (AU)

( * ) Notice: Subject to any disclaimer, the term of this patent is extended or adjusted under 35 U.S.C. 154(b) by 729 days.

(21) Appl. No.: 17/055,522

(22) PCT Filed: May 14, 2019

(86) PCT No.: PCT/AU2019/050448
§ 371 (c)(1),
(2) Date: Nov. 13, 2020

(87) PCT Pub. No.: WO2019/218001
PCT Pub. Date: Nov. 21, 2019

(65) Prior Publication Data
US 2021/0224952 A1 Jul. 22, 2021

(30) Foreign Application Priority Data

May 15, 2018 (AU) .............................. 2018901690

(51) Int. Cl.
*G06T 3/40* (2006.01)
*G01R 33/48* (2006.01)
(Continued)

(52) U.S. Cl.
CPC ........ *G06T 3/4076* (2013.01); *G01R 33/4818* (2013.01); *G01R 33/5608* (2013.01); *G06T 3/4046* (2013.01)

(58) Field of Classification Search
CPC ................ G06T 3/4076; G06T 3/4046; G06T 2207/10088; G06T 2207/20084;
(Continued)

(56) References Cited

U.S. PATENT DOCUMENTS 6,256,347 B1 * 7/2001 Yu .......................... H04N 19/98
375/E7.266
6,269,186 B1 * 7/2001 Makita ................. G06V 30/162
382/172

(Continued)

FOREIGN PATENT DOCUMENTS

WO 2017113205 A1 7/2017

OTHER PUBLICATIONS

Jang et al., "ANFIS: Adaptive-Network-Based Fuzzy Inference System," IEEE Transactions of Systems, Man, and Cybernetics, 23(3): May 1, 1993, pp. 665-685.

(Continued)

*Primary Examiner* — Ali Bayat
(74) *Attorney, Agent, or Firm* — Davis Wright Tremaine LLP (57) ABSTRACT

A method and system for reconstructing magnetic resonance (MR) images, the method including the steps of: receiving an under-sampled MR image, the under-sampled MR image being transformed from under-sampled k-spaced data; classifying intensity of each pixel in the under-sampled MR image to one of a plurality of predetermined quantized values of intensity by using a neural network; and generating a reconstructed MR image based on the classified quantized value of the intensity for each pixel in the under-sampled MR image.

17 Claims, 7 Drawing Sheets

(51) Int. Cl.
  *G01R 33/56* (2006.01)
  *G06T 3/4046* (2024.01)
  *G06T 3/4076* (2024.01)

(58) Field of Classification Search
  CPC ............ G01R 33/4818; G01R 33/5608; G01R 33/5602; G01R 33/5611; G01R 33/5619; G06N 3/045; G06N 3/08; G06N 3/048
  USPC ........................................................ 382/299
  See application file for complete search history.

(56) References Cited

U.S. PATENT DOCUMENTS

| | | | | |
|---|---|---|---|---|
| 2010/0232698 | A1* | 9/2010 | Bentrem | G06T 5/002 |
| | | | | 382/173 |
| 2017/0309019 | A1* | 10/2017 | Knoll | G01R 33/5611 |
| 2018/0260975 | A1* | 9/2018 | Sunkavalli | G06N 3/045 |
| 2019/0182505 | A1* | 6/2019 | Chuang | H04N 19/52 |
| 2019/0243928 | A1* | 8/2019 | Rejeb Sfar | G06V 10/454 |

OTHER PUBLICATIONS

Jia et al., "Caffe: Convolutional Architecture for Fast Feature Embedding," Jun. 20, 2014, 4 pages.
Kappeler et al., "Video Super-resolution with Convolutional Neural Networks," IEEE Transactions on Computational Imaging, 2(2): Jun. 1, 2016, pp. 109-122.
Lecun et al., "Deep Learning," Nature, 521(7553): May 28, 2015, 9 pages.
Lee et al., "Compressed Sensing and Parallel MRI using Deep Residual Learning," ISMRM, 2017, 2 pages.
Ronneberger et al., "U-Net: Convolutional Networks for Biomedical Image Segmentation," International Conference on Medical Image Computing and Computer-Assisted Intervention, May 18, 2015, pp. 234-241.
Russakovsky et al., "ImageNet Large Scale Visual Recognition Challenge," International Journal of Computer Vision, Dec. 1, 2015, 115(3): 37 pages.
Schlemper et al., "A Deep Cascade of Convolutional Neural Networks for MR Image Reconstruction", IEEE Transactions on Medical Imaging, 37(2): Feb. 1, 2018, pp. 491-503.
Wang et al., "Deep Networks for Image Super-Resolution with Sparse Prior," Proceedings of the IEEE International Conference on Computer Vision 2015, Feb. 18, 2016, pp. 370-378.
Yüksel et al., "A Simple Generalized Neuro-Fuzzy Operator for Efficient Removal of Impulse Noise from Highly Corrupted Digital Images," AEU—International Journal of Electronics and Communications, 59(1): Mar. 1, 2005, pp. 1-7.
Zhu et al., "Neural Network MR Image Reconstruction with Automap: Automated Transform by Manifold Approximation," ISMRM, 2017, 3 pages.

* cited by examiner

METHOD AND SYSTEM OF IMAGE RECONSTRUCTION FOR MAGNETIC RESONANCE IMAGING

FIELD

The present invention generally relates to a method and system of image reconstruction for medical imaging, and in particular magnetic resonance imaging (MRI).

BACKGROUND

Magnetic resonance imaging (MRI) is a preferred imaging modality for soft tissue imaging due to its excellent soft tissue contrast. However, the scan times of MRI are often longer compared to other medical imaging modalities such as CT or ultrasound.

One way to achieve faster MRI scan is to reduce k-space data by k-space under-sampling. The under-sampled k-space MR data needs to be reconstructed into MR image.

One method of reconstructing MR images from under-sampled MR data is parallel imaging, which uses multiple signal receiver coils located at different spatial location around the patient. Each receiver coil receives the same signal but with a different sensitivity modulation. The spatial sensitivity information of the receiver coils provides slightly different measurement of the same signal. Given a priori known sensitivity information of the receiver coils, the MR image can be reconstructed from the under-sampled data collected from the set of receiver coils.

Another method of reconstructing MR images from under-sampled MR data involves compressive sensing. This technique exploits the fact that MR images can be sparsely represented in some domain such as wavelet or total signal variation. Compressive sensing recovers the sparse representation of the image from under-sampled data using non-linear iterative reconstruction. However, the iterative algorithm used in compressive sensing may be time consuming and may require significant computational power. Further, the acceleration achieved by compressive sensing techniques depends on the inherent sparsity of the images.

It is desired to address the above, or to at least provide a useful alternative.

SUMMARY

According to one aspect, the present invention provides a method for reconstructing magnetic resonance (MR) images, the method including the steps of:
receiving an under-sampled MR image, the under-sampled MR image being transformed from under-sampled k-spaced data;
classifying intensity of each pixel in the under-sampled MR image to one of a plurality of predetermined quantized values of intensity by using a neural network; and
generating a reconstructed MR image based on the classified quantized value of the intensity for each pixel in the under-sampled MR image.

According to a second aspect, the present invention provides a system for reconstructing magnetic resonance (MR) images, the system including at least one processer configured to:
receive an under-sampled MR image, the under-sampled MR image being transformed from under-sampled k-spaced data;

classify intensity of each pixel in the under-sampled MR image to one of a plurality of predetermined quantized values of intensity by using a neural network; and
generate a reconstructed MR image based on the classified quantized value of the intensity for each pixel in the under-sampled MR image.

According to a third aspect, the present invention provides a method for reconstructing medical images, the method including the steps of:
receiving an under-sampled medical image;
classifying intensity of each pixel in the under-sampled medical image to one of a plurality of predetermined quantized values of intensity by using a neural network; and
generating a reconstructed medical image based on the classified quantized value of the intensity for each pixel in the under-sampled medical image.

According to a fourth aspect, the present invention provides a system for reconstructing medical images, the system including at least one processer configured to:
receive an under-sampled medical image;
classify intensity of each pixel in the under-sampled medical image to one of a plurality of predetermined quantized values of intensity by using a neural network; and
generate a reconstructed medical image based on the classified quantized value of the intensity for each pixel in the under-sampled medical image.

BRIEF DESCRIPTION OF THE DRAWINGS

Embodiments of the present invention are hereinafter described, by way of example only, with reference to the accompanying drawings, wherein.

DESCRIPTION

An embodiment provides a method and a system for reconstructing MR images from under-sampled MR data. The method and system uses a machine learning based approach to reconstruct MR images from under-sampled MR data, and a convolutional neural network for image reconstruction is trained using simulated under-sampled MR data.

The convolutional neural network is trained to classify each pixel in an under-sampled MR image (i.e., MR image transformed from under-sampled k-space data) to a quantized value of intensity, the quantized value being one of a plurality of predetermined quantized values.

In this way, the task of image reconstruction is converted into a pixel classification task. This conversion facilitates the accurate reconstruction of the image.

The quantized value in the reconstructed image has a smaller bit depth compared to the intensity of each pixel in the under-sampled MR image. This reduces the usage of memory space and the computational complexity.

For example, the intensity of each pixel in the under-sampled image may be represented by a floating point number (e.g., a single-precision floating point number that typically occupies 32 bits, or a double-precision floating point number that typically occupies 64 bits), while the quantized value may be a 8-bit number and accordingly the intensity of each pixel is classified into one of 256 different classes. Alternatively, the reconstructed image may be represented using more bits for each pixel at the expense of memory usage and computational complexity.

The method and system can significantly reduce the MR scan time without compromising the image quality. The method and system do not use an iterative reconstruction algorithm and thus saves computational cost. Further, the image quality achieved using the described method and system has a significant SNR improvement compared to compressive sensing.

The described method and system may be used to complement the parallel imaging image reconstruction techniques, and thereby improve the performance for MR parallel imaging applications.

General Structure

Figure 1:
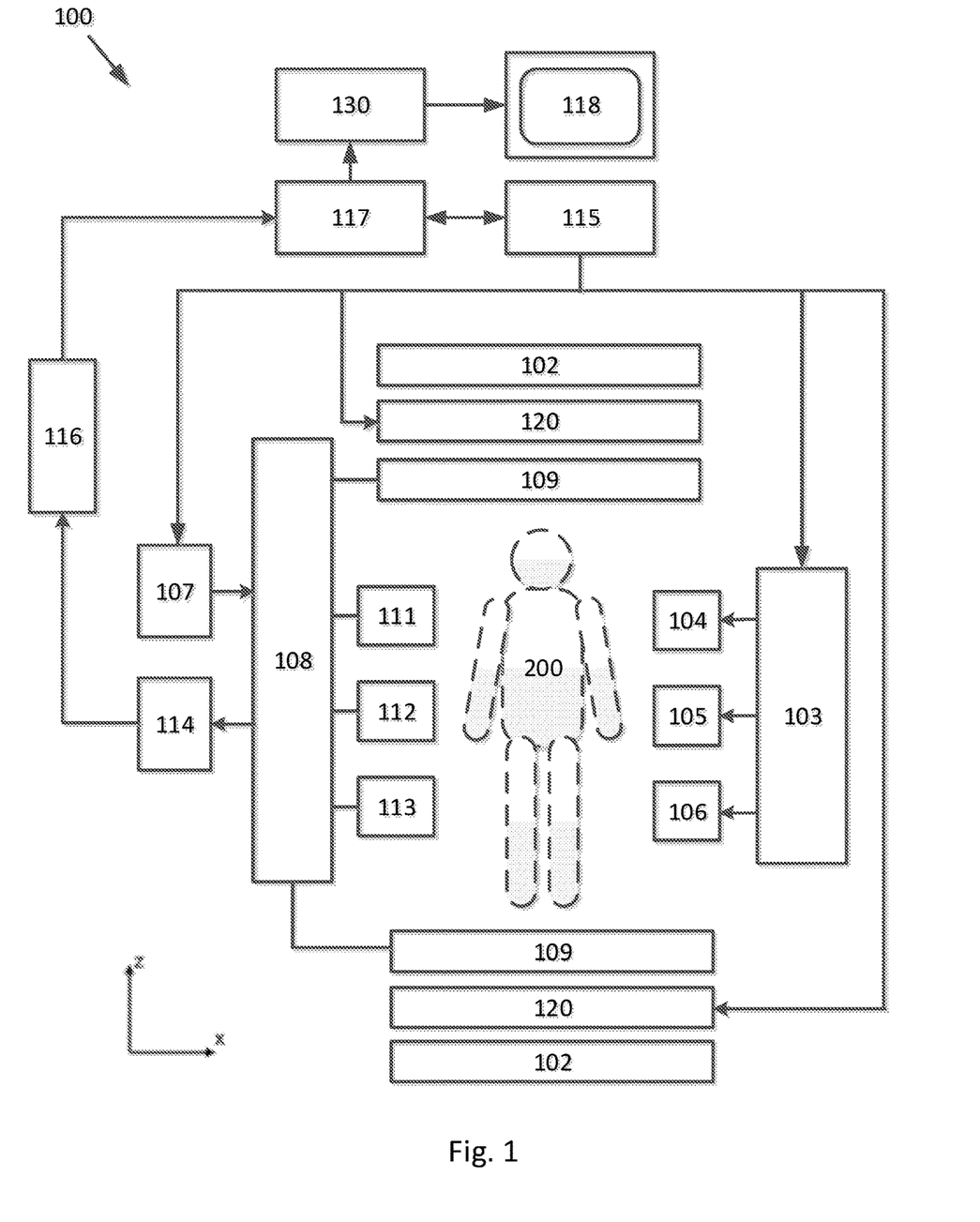
FIG. 1 shows an example of a system for MR image reconstruction.

An example of a system 100 for reconstructing under-sampled MR image is illustrated in FIG. 1.

In this example, the system 100 also includes components of an MRI machine for carrying out the functions of an MRI scanner, e.g., performing MR scans and acquiring MRI images.

As shown in FIG. 1, the system 100 includes superconducting or resistive main magnet coils 102 for creating a substantially uniform, temporally constant main magnetic field BO along a z-axis through an examination volume.

The system 100 further includes a set of shimming coils 120. The current flow through the individual shimming coils 120 is controllable to minimize BO deviations within the examination volume.

A gradient pulse amplifier 103 applies current pulses to selected ones of whole-body gradient coils 104, 105 and 106 along x, y and z-axes of the examination volume. A digital RF frequency transmitter 107 transmits RF pulses or pulse packets, via a send/receive switch 108, to body RF coils 109 to transmit RF pulses into the examination volume. The RF pulses are used to saturate, excite resonance, invert magnetization, refocus resonance, or manipulate resonance and select a portion of a patient's body 200 positioned in the examination volume.

In order to generate MR images of the patient's body 200 by means of parallel imaging, a set of local array RF coils 111, 112, 113 for receiving MR signals are placed contiguous to the region selected for imaging.

The MR signals induced by body-coil RF transmissions are picked up by the array RF coils 111, 112, 113 and/or by the body RF coils 109, and are subsequently demodulated via the send/receive switch 108 by a receiver 114, and preferably the receiver 114 includes a preamplifier.

A controller 115, for example in the form of a host computer, controls the shimming coils 120, the gradient pulse amplifier 103 and the transmitter 107 to generate MR imaging sequences, e.g., fast field echo (FFE) sequences.

For the selected sequence, the receiver 114 receives a single or a plurality of MR data lines following each RF excitation pulse.

The received analogue signals of each MR data line are then converted into a digital format by a data acquisition module 116. In some alternative embodiments, the data acquisition module 116 may be formed as a separate device rather than being part of the MRI machine 100.

The digital raw image data is then sent to a processor 117, which transforms the digital raw image data in the k-space into an MR image representation by applying a suitable transformation algorithm, for example a Fourier transform. This transformed MR image may represent, for example, a planar slice through the patient, an array of parallel planar slices, a three-dimensional volume, or the like.

In order to reduce the MRI scan time, k-space under-sampling is performed. A reduced number of k-space points are collected and compared to the full number of k-space points demanded by the Nyquist criterion. This results in under-sampling artefacts in the transformed MR image (also referred to as the "under-sampled MR image") output by the processor 117.

In order to remove or reduce the under-sampling artefacts, the under-sampled MR image generated by the processor 117 is subsequently processed by an image reconstruction module 130, which generates a reconstructed MR image based on the under-sampled MR image.

The reconstructed MR image output by the image reconstruction module 130 is then stored in a data store of the module 130 where it can be accessed for converting slices, projections, or other portions of the image representation into appropriate format for visualization, for example via a video monitor 118 which provides a readable display of the reconstructed MR image.

The image reconstruction module 130 includes a trained deep learning model for image reconstruction. Preferably, the image reconstruction module 130 is implemented by machine executable computer program instructions embedded in and executed by the processor 117. The image reconstruction module 130 in addition to being implemented by embedded firmware, may be implemented by dedicated hardware, such as an ASIC or FPGA. The processor 117 and module 130 are preferably implemented by a GPU cluster.

Deep Learning Model

Figure 2:
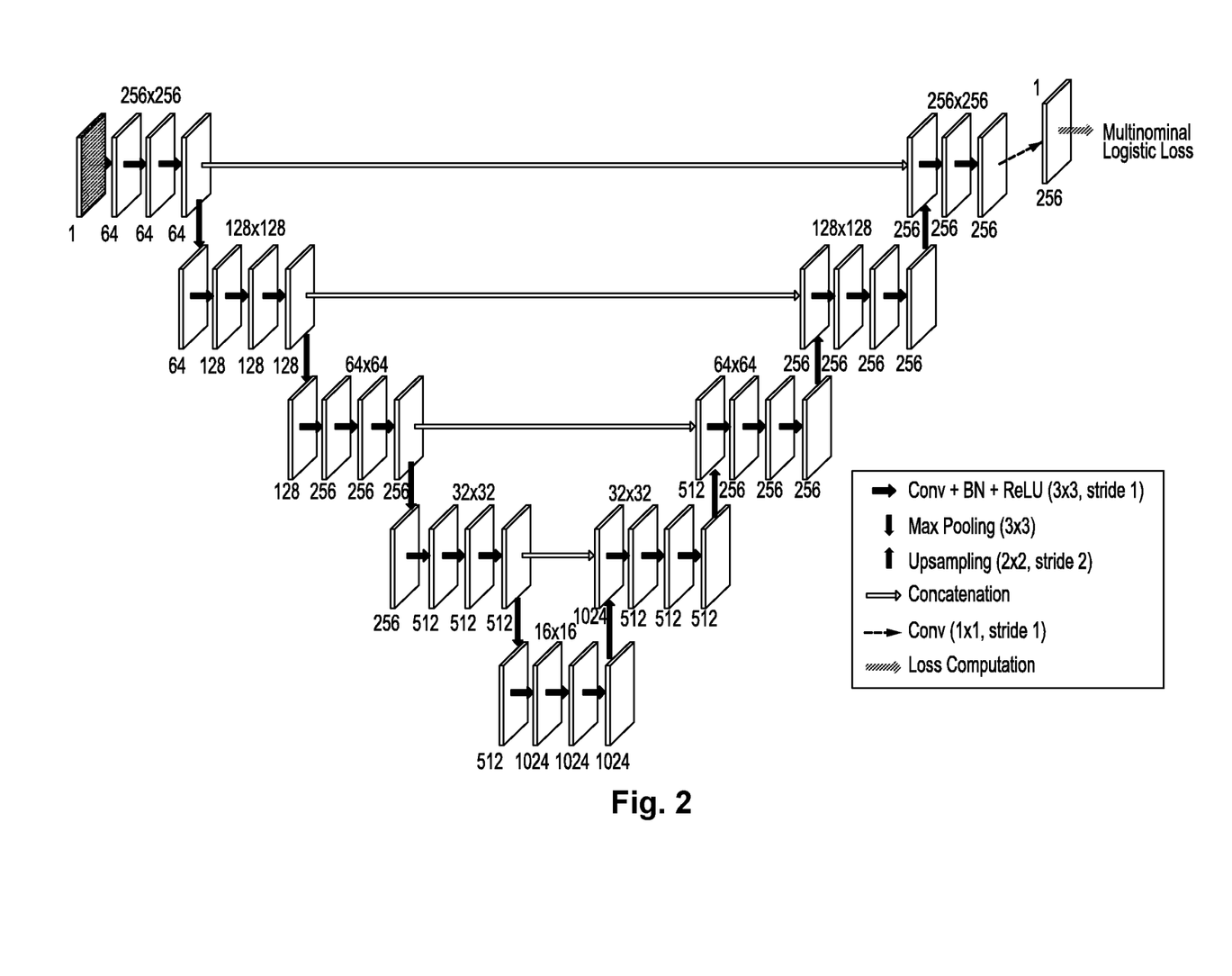
FIG. 2 shows one exemplary architecture of a convolutional neural network for MR image reconstruction.

In this embodiment, the deep learning model of the image reconstruction module 130 is a convolutional neural network (CNN). FIG. 2 illustrates an exemplary architecture of the CNN.

This CNN architecture is designed and trained for image reconstruction. The input to the network is 256×256 under-sampled MR images with the intensity of each pixel being a floating point number value (e.g., a single-precision floating point number that typically occupies 32 bits, or a double-precision floating point number that typically occupies 64 bits), and the output is 8-bit quantized reconstructed images (each pixel being represented by a 8-bit number). In this way, the CNN transforms the image reconstruction task into a pixel classification task.

Preferably, the pixel intensity is the grey level intensity of the pixel. However, in some alternative embodiments, the pixel intensity may be the intensity of the pixel in one or more suitable colour channels.

As shown in FIG. 2, the CNN in this embodiment is an encoder-decoder CNN, having an encoder network (on the left) and a decoder network (on the right) followed by a pixel intensity classification layer.

The encoder network includes a contracting path having a series of convolution and pooling layers. More specifically, the contracting path includes the repeated application of three 3×3 convolutions (stride 2, pad 1). In each level, the 3×3 convolution is followed by a batch normalization (BN) operation and a rectified linear unit (ReLU), and a 3×3 max pooling operation for downsampling. The downsampling halves the height and width dimensions at each successive level. The numbers at the top of each block in FIG. 2 show the resolution of the data and the number at the bottom of each block shows the number of filtered outputs (the filtered outputs may also be referred to as a "feature map").

The decoder network includes an expansive path having a series of 2×2 upsampling operations (stride 2) of the feature map, each followed by a 3×3 convolution with stride 1, a batch normalization operation and a rectified linear unit (ReLU). Each upsampling operation increases the resolution of the corresponding feature map.

In addition to the expansive path, the decoder network also includes a number of concatenation paths which concatenate the upsampled feature maps with the corresponding feature maps passed directly from the encoder network.

The last layer of the CNN is a classification layer using a 1×1 convolution with stride 1. The classification layer treats the output as a quantized 8-bit image and predicts the probability of each pixel being in one of the 256 different classes. In this way, the classification layer predicts the quantized image intensity level for the reconstructed image. In the training stage, a multinomial logistic loss function (also known as "cross entropy loss") is used to evaluate the classification performance of the CNN. Alternatively, any other suitable categorical loss function may be used as the loss function in training the CNN, e.g., Kullback-Leibler (KL) divergence loss.

The choice of the loss function is a major difference between classification and other types of machine learning tasks such as regression. The loss function chosen for a classification task reflects a measure of the correctness of the classification result, while the regression loss functions usually measures the residual of the results. This is because the goal of a classification task is to minimize the risk of wrong classification, while the goal of a regression task is usually to minimize the residual of the regression model.

In total, the encoder-decoder CNN shown in FIG. 2 includes 5 levels (each level shown by a different row of blocks in FIG. 2). Alternatively, in some other embodiments, the encoder-decoder CNN may include any suitable number of levels, depending on the input image size. In the last level, the size of the feature map should be greater than the size of the convolutional kernel. For example, for the 256×256 input image in the above-described example, the CNN may include up to 7 levels to allow the use of a 3×3 convolutional kernel. In the example where the CNN has 7 levels, at level 7, the spatial size of the feature map is 4×4.

Further, in some other embodiments, the encoder-decoder CNN may have any suitable alternative architecture different from the one shown in FIG. 2. For example, variation may be made to one or more characteristics of the CNN architecture, such as the number of CNN layers, the kernel size of convolution, and/or the stride. Additionally, the CNN may have one or more regularization layers, such as dropout layers.

Further, in some other embodiments, the CNN used in the image reconstruction module 130 may not be an encoder-decoder CNN, but any other suitable type of image to image mapping CNN.

Training of the Deep Learning Model

Figure 3:
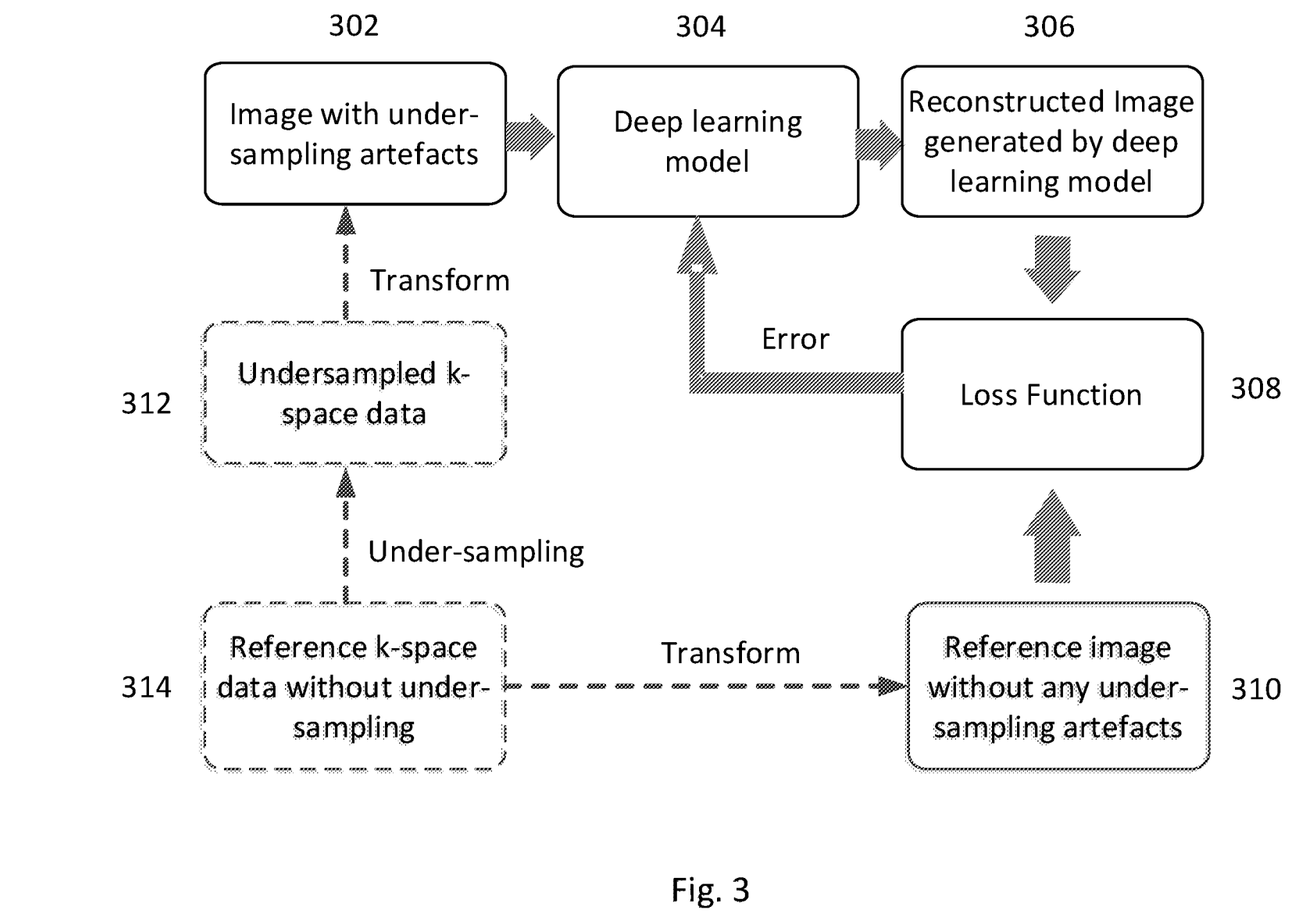
FIG. 3 is a schematic diagram showing the training of a deep learning model for MR image reconstruction.

FIG. 3 is a schematic diagram showing the training of the deep learning model used in the image reconstruction module 130.

In order to train the deep learning model (304), under-sampled MR images (i.e., images with under-sampling artefacts, shown by block (302) are produced and fed to the deep learning model (304).

Using the images with under-sampling artefacts (302), the deep learning model generates corresponding reconstructed MR images (306). For each reconstructed image, an error is calculated using a loss function (308) based on a corresponding reference MR image that does not contain under-sampling artefact (310). As described above, for the CNN of FIG. 2, the error is calculated using a multinomial logistic loss function or any other suitable categorical loss function. The error is used to tune the parameters of the deep learning model. The image reconstruction and tuning process are iterated until desired reconstruction performance is achieved. The tuning of the parameters may be conducted by executing existing CNN training algorithms, such as stochastic gradient descent (SGD), AdaGrad, AdaDelta, RMSProp, or other suitable gradient descent optimizers.

As shown by the dashed lines in FIG. 3, the images with under-sampling artefacts (302) may be produced by under-sampling reference k-space data (314) to generate under-sampled k-space data (312), and then transforming the under-sampled k-space data (312) to MR images. The same reference k-space data (314) is also used for generating the reference image without under-sampling artefacts (310).

The training of the deep learning model as shown in FIG. 3 may be performed on external hardware separate from the system 100, for example, a separate graphics processing unit (GPU). After training, the deep learning model is embedded as the image reconstruction module 130 in the system 100.

Figure 4:
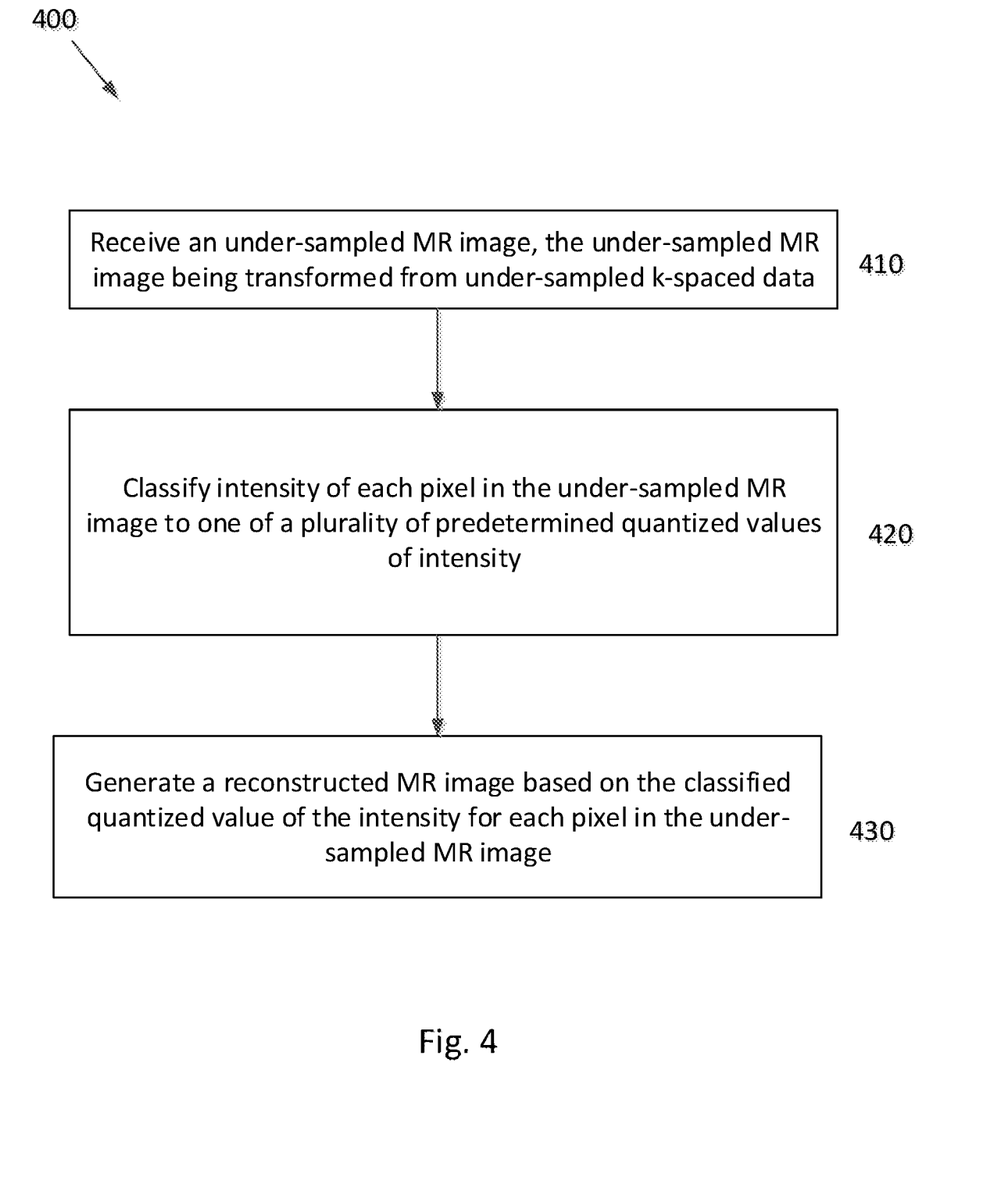
FIG. 4 shows steps executed by a processor in an MR image reconstruction process.

FIG. 4 illustrates an image reconstruction process 400 implemented by the image reconstruction module 130 of the system 100.

At step 410, the image reconstruction module 130 receives an under-sampled MR image, the under-sampled MR image being transformed from under-sampled k-spaced data.

At step 420, the image reconstruction module 130 classifies intensity of each pixel in the under-sampled MR image to one of a plurality of predetermined quantized values of intensity by using a neural network, i.e. the trained CNN.

At step 430, the image reconstruction module 130 generates a reconstructed MR image based on the classified quantized value of the intensity for each pixel in the under-sampled MR image.

Example

MPRAGE images from 43 subjects were used for training, and MPRAGE images from 10 subjects were used for testing. The reference images (also referred to as "label images") for the classification network were represented in 8-bit unsigned integers.

The k-space data were pseudo randomly under-sampled by a factor of 3.2 in the phase encoding direction and the MR images transformed from the under-sampled data were used as inputs to the network.

The CNN was trained on 2D slices using a stochastic gradient descent algorithm in the CAFFE deep learning library.

Figure 5:
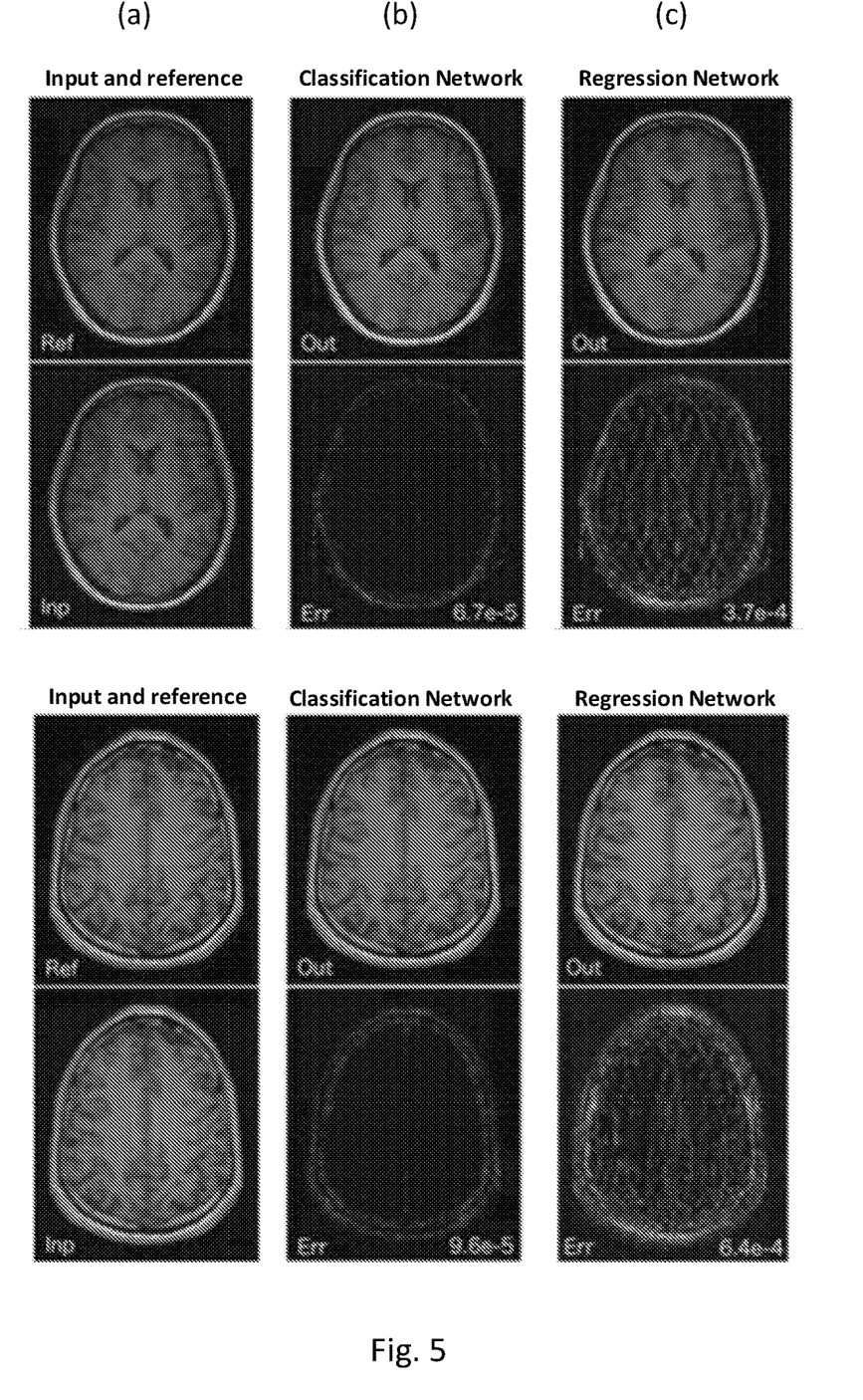
FIG. 5 shows results of applying image reconstruction on under-sampled MR data.

FIG. 5 shows the results of applying image reconstruction on under-sampled data for two of the test cases.

Column (b) of FIG. 5 shows the result of using the classification CNN described above, in which the loss function used is multinomial logistic loss. The network predicts the probability for each pixel being in one of the 256 different classes. The outputs are images represented by 8-bit unsigned integers, which are converted to image represented by floating points by simply scaling between 0 and 1. As shown, the under-sample artefacts in the output images are effectively reduced compared to the input images.

In comparison, column (c) of FIG. 5 shows the results of applying image reconstruction to the data of the same test cases by using a regression network, in which the loss function used is mean squared loss. This network predicts the floating-point representation of the reconstructed image.

As shown, the reconstructed images in column (b) generated by using the classification network contain less undersampling artefacts compared to the reconstructed images in column (c) generated by using the regression network.

For comparison purposes, the mean squared error of the images reconstructed from the classification network was calculated, and the result was six times lower than the image reconstructed from the regression network, which shows the effectiveness of the described classification CNN model in image reconstruction for MRI.

Figure 6:
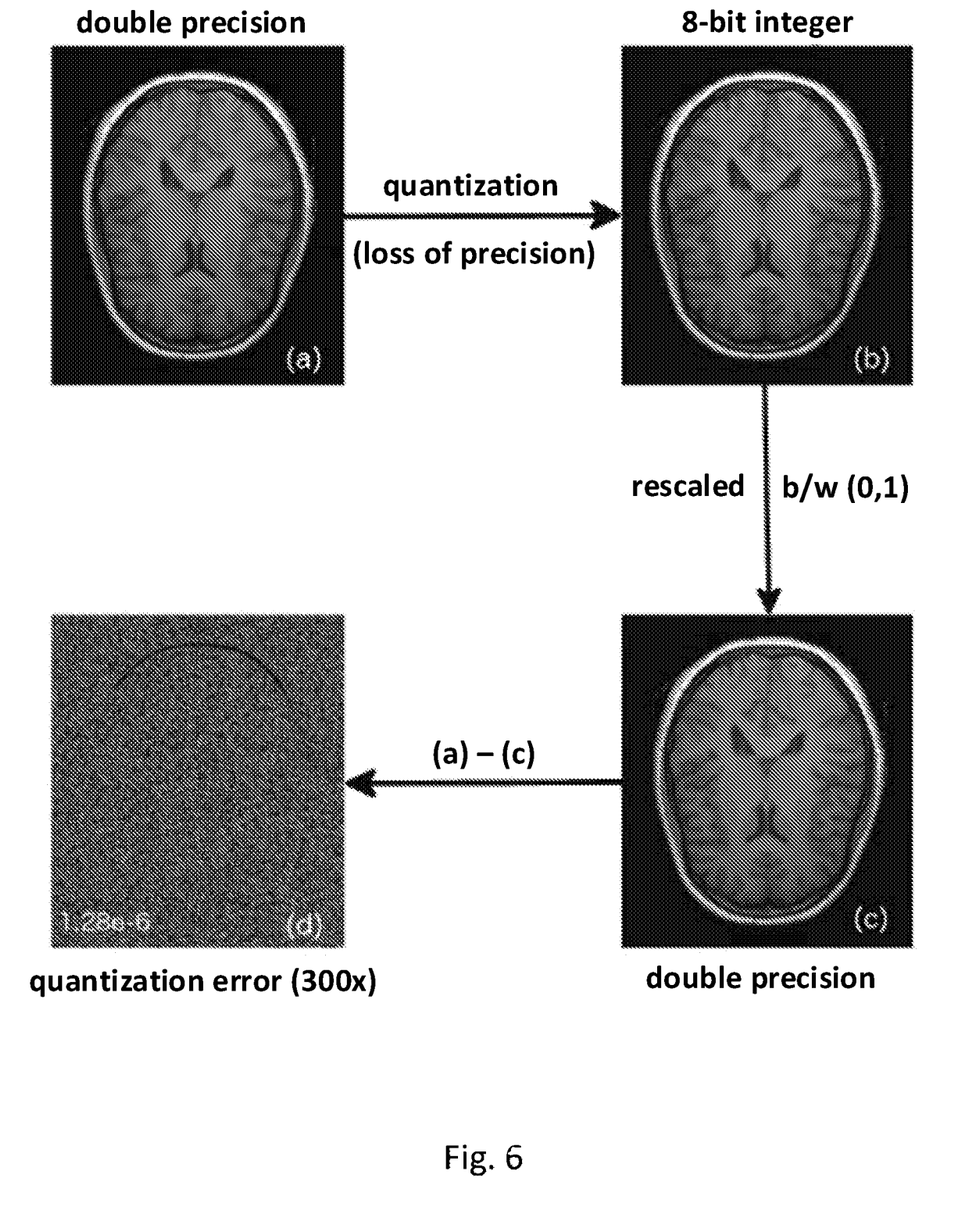
FIG. 6 shows quantification of the inherent error due to quantization in a classification network.

For the regression network, the source of error is the prediction error arising from inaccurate learning of input-output mapping. By contrast, the error in the classification network arises from two sources, including: (i) the predication error arising from the network, and (ii) the second error being the quantization error arising from fixed point representation. FIG. 6 shows quantification of the inherent error due to quantization in the classification network.

FIG. 6 (a) shows a double precision image scaled between [0,1]. FIG. 6 (b) shows an unsigned 8-bit representation of image, generated from (a). This step introduces quantization error due to fixed point conversion. FIG. 6 (c) shows the same image in (b) converted to double precision by scaling. FIG. 6 (d) shows the quantization error image (scaled by 300× for viewing) generated by subtracting the original image of (a) and the quantized version of (c). As evident from FIG. 6 (d), the quantization error (mean squared error: 1.28e-6) is significantly lower than the overall error (mean squared error: 6.7e-5), showing that quantization has minimal effect on overall error. In some embodiments, the quantization error can be further reduced by representing the target image using more bits at the expense of memory usage and computational complexity.

Higher Bit Precision Pixel Classification

In the example shown in FIG. 2, the classification layer treats the output as a quantized 8-bit image (in other words, the quantized value of intensity for each pixel is an 8-bit number) and predicts the probability of each pixel being in one of the 256 different classes.

Alternatively, the reconstructed image may be represented using more bits for each pixel. However, the memory requirement for the neural network increases exponentially with the bit-depth of the quantized value. The dynamic range of an n-bit unsigned number $N_{n\_bit}$ is $[0, 2^{n-1}]$. In order to predict the probability for each possible pixel intensity, using the pixel classification method as described above requires $2^n$ channels at the output of the network. The number of channels can be undesirably large, for instance 65536 channels for a 16 bit-depth image. The large number of channels may be difficult to implement due to physical memory limitation of the computer system, and the model may be difficult to generalize due to overfitting from increased number of parameters.

In order to reduce the computational complexity and memory usage required by the classification network for higher bit precision, a divide-and-conquer approach is used. Specifically, for higher bit-depth predication, an n-bit integer number $N_{n\_bit}$ representing the pixel intensity is split as a linear combination of two n/2-bit numbers $a_0$ and $a_1$:

$$N_{n\_bit} = (2^{n/2} a_0 + a_1); \forall a_0, a_1 \in [0, 2^{n/2} - 1] \quad (1)$$

For instance, a 16-bit integer number can be represented as:

$$N_{16\_bit} = (256 a_0 + a_1); \forall a_0, a_1 \in [0, 255] \quad (2)$$

As described in (1), both $a_0$ and $a_1$ belongs to a n/2-bit number, therefore the convolutional neural network in FIG. 2 can be modified to predict both $a_0$ and $a_1$, and (1) can then be used to compute the n-bit value $N_{n\_bit}$. This approach allows the convolutional neural network to be used for reconstructing higher bit images, without significant increase in the number of parameters or in computational complexity. For instance, using this approach, the number of channels required in the output layer to predict a 16-bit image is reduced from 65536 to only 256.

Figure 7:
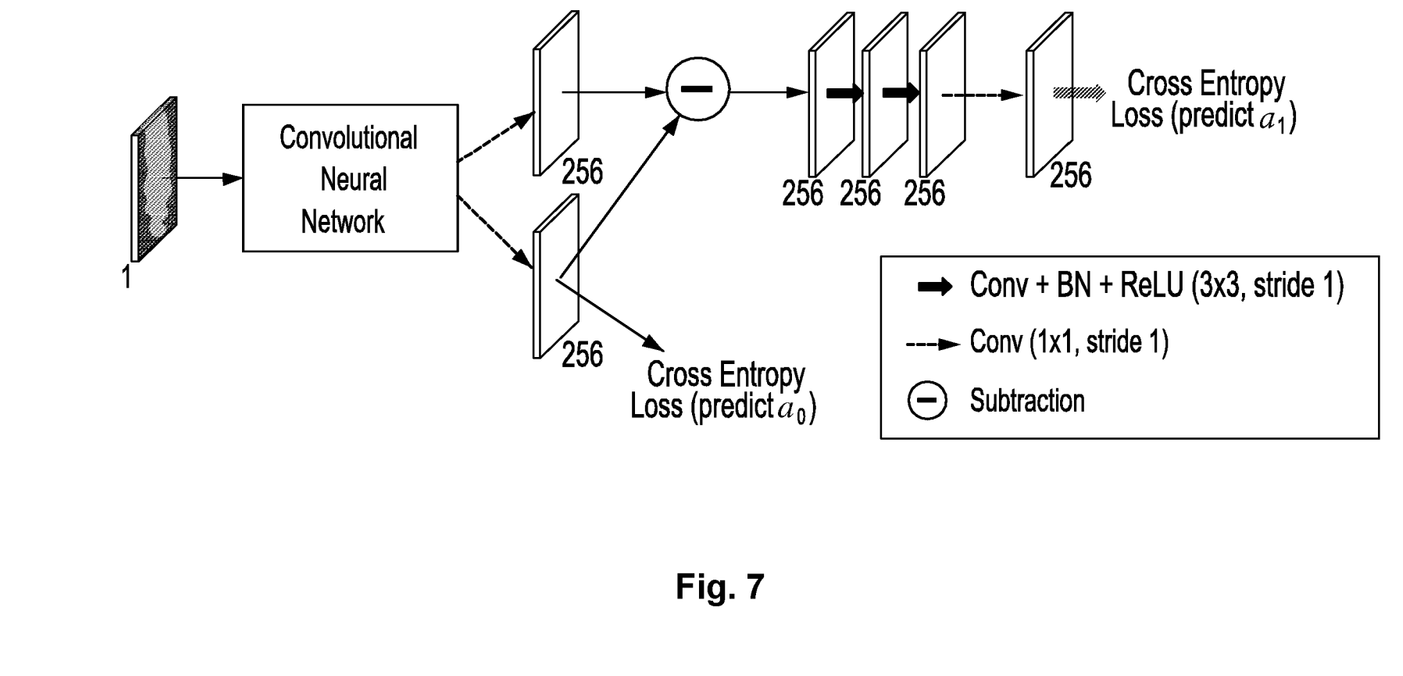
FIG. 7 shows another exemplary architecture of a convolutional neural network for MR image reconstruction.

FIG. 7 shows an exemplary network architecture for reconstructing an image of 16-bit precision pixel intensity values using the pixel classification approach. As shown in FIG. 7, the convolutional neural network has two outputs $a_0$ and $a_1$. Both $a_0$ and $a_1$ are 256 channel outputs predicting the probability distribution of two 8-bit numbers. Both the probability distributions are used to compute the pixel intensity value using (2). The convolutional neural network in FIG. 7 may have the same architecture as the example shown in FIG. 2 without the last classification layer. In other words, the last classification layer (which uses the 1×1 convolution with stride 1) in FIG. 2 is replaced by the two classification paths in FIG. 7 for outputting $a_0$ and $a_1$ respectively.

Similarly, this divide-and-conquer approach may be used for reconstructing images of further higher bit precision, e.g., 32-bit, 64-bit, or more, by dividing the predicted intensity value for each pixel into a plurality of groups of integer numbers $a_0, a_1, \ldots a_n$.

Accordingly, in the image reconstruction process 400 shown in FIG. 4, the classification step 420 may include:

converting the plurality of predetermined quantized values of intensity into a plurality of groups of values with a smaller bit depth than the predetermined quantized values of intensity;

for each group, classifying the intensity of each pixel in the under-sampled MR image to one of the values in that group by using the neural network; and generating the classified quantized value of the intensity for each pixel based on the classified value in each group.

Each of the predetermined quantized values may include a first group of bits and a second group of bits. Correspondingly, the plurality of groups of values may include at least:

a first group of values, representing values of the first group of bits of the predetermined quantized values; and a second group of values, representing values of the second group of bits of the predetermined quantized values.

As shown in the above-described example, the first group of bits (e.g., $a_0$) may be higher-order bits of the predetermined quantized values than the second group of bits (e.g., $a_1$).

By developing and utilising a deep learning model for image reconstruction, the described method and system significantly reduces the MR scan time without compromising the image quality.

As the method and system do not use an iterative reconstruction algorithm, the computational cost can be lowered and a higher SNR can be achieved compared to the compressive sensing technique.

The method and system may be used to complement existing MR image reconstruction techniques such as parallel imaging, which can improve the performance for MR parallel imaging applications.

Further, the use of the method is not limited to MR images, but may also include image reconstruction for other medical imaging modalities.

For example, the method may be used to reconstruct images from data collected in under-sampled computed tomography (CT) scans. Whilst the scan time reduction is not a major concern in CT, minimisation of the radiation exposure to the patient is very important. Using the method, a smaller number of angular projections will be required to reconstruct a CT image. This will significantly reduce the radiation dose to the patient, e.g., by a factor of three.

Further, as described hereinbefore, the deep learning model is not limited to the encoder-decoder CNN or the specific architecture in the described embodiments, but may include any other suitable type of CNN with any suitable architecture.

The reference in this specification to any prior publication (or information derived from it), or to any matter which is known, is not, and should not be taken as an acknowledgment or admission or any form of suggestion that that prior publication (or information derived from it) or known matter forms part of the common general knowledge in the field of endeavour to which this specification relates.

Many modifications will be apparent to those skilled in the art without departing from the scope of the present invention as hereinbefore described with reference to the accompanying drawings.

The invention claimed is:

1. A method for reconstructing magnetic resonance (MR) images, the method including the steps of:
receiving an under-sampled MR image, the under-sampled MR image being transformed from under-sampled k-spaced data;
classifying intensity of each pixel in the under-sampled MR image to one of a plurality of predetermined quantized values of intensity by using a neural network; wherein each of the predetermined quantized values of intensity has a smaller bit depth than the intensity of each pixel in the under-samples MR image and
generating a reconstructed MR image based on the classified quantized value of the intensity for each pixel in the under-sampled MR image.

2. The method of claim 1, wherein the neural network is a convolutional neural network (CNN).

3. The method of claim 2, wherein the CNN is an encoder-decoder CNN that includes an encoder network and a decoder network.

4. The method of claim 3, wherein the encoder network includes a series of convolution and pooling layers, each pooling layer being subsequent to a corresponding convolution layer.

5. The method of claim 3, wherein the decoder network includes a series of upsampling and convolution layers, each convolution layer being subsequent to a corresponding upsampling layer.

6. The method of claim 5, wherein the decoder network concatenates output of each upsampling layer with a corresponding feature map generated by the encoder network.

7. The method of claim 3, wherein the CNN further includes a pixel intensity classification layer subsequent to the decoder network.

8. The method of claim 1, wherein the neural network is trained by using a multinomial logistic loss function.

9. The method of claim 1, further including:
transforming under-sampled k-space data to the under-sampled MR image.

10. The method of claim 9, further including:
receiving raw MR signals generated during a magnetic resonance imaging (MM) scan; and
generating the under-sampled k-space data based on the raw MR signals.

11. The method of claim 1, wherein classifying the intensity of each pixel in the under-sampled MR image to one of the plurality of predetermined quantized values of intensity includes:
converting the plurality of predetermined quantized values of intensity into a plurality of groups of values with a smaller bit depth than the predetermined quantized values of intensity;
for each group, classifying the intensity of each pixel in the under-sampled MR image to one of the values in that group by using the neural network; and
generating the classified quantized value of the intensity for each pixel based on the classified value in each group.

12. The method of claim 11, wherein:
each of the predetermined quantized values includes a first group of bits and a second group of bits; and
wherein the plurality of groups of values include at least:
a first group of values, representing values of the first group of bits of the predetermined quantized values; and
a second group of values, representing values of the second group of bits of the predetermined quantized values.

13. The method of claim 12, wherein the first group of bits are higher-order bits of the predetermined quantized values than the second group of bits.

14. A system for reconstructing magnetic resonance (MR) images, the system including at least one processor configured to:
receive an under-sampled MR image, the under-sampled MR image being transformed from under-sampled k-spaced data;
classify intensity of each pixel in the under-sampled MR image to one of a plurality of predetermined quantized values of intensity by using a neural network; wherein each of the predetermined quantized values of intensity has a smaller bit depth than the intensity of each pixel in the under-sampled MR image and
generate a reconstructed MR image based on the classified quantized value of the intensity for each pixel in the under-sampled MR image.

15. The system of claim 14, wherein the system is an MR scanner.

16. A method for reconstructing medical images, the method including the steps of:
receiving an under-sampled medical image;
classifying intensity of each pixel in the under-sampled medical image to one of a plurality of predetermined quantized values of intensity by using a neural network; wherein each of the predetermined quantized values of intensity has a smaller bit depth than the intensity of each pixel in the under-sampled medical image and
generating a reconstructed medical image based on the classified quantized value of the intensity for each pixel in the under-sampled medical image.

17. A system for reconstructing medical images, the system including at least one processer configured to:
- receive an under-sampled medical image;
- classify intensity of each pixel in the under-sampled medical image to one of a plurality of predetermined quantized values of intensity by using a neural network; wherein each of the predetermined quantized values of intensity has a smaller bit depth than the intensity of each pixel in the under-sampled medical image and
- generate a reconstructed medical image based on the classified quantized value of the intensity for each pixel in the under-sampled medical image.

* * * * *